United States Patent
Sinclair et al.

(10) Patent No.: US 8,952,344 B2
(45) Date of Patent: *Feb. 10, 2015

(54) TECHNIQUES FOR PROCESSING PHOTORESIST FEATURES USING IONS

(71) Applicant: Varian Semiconductor Equipment Associates, Inc., Gloucester, MA (US)

(72) Inventors: Frank Sinclair, Quincy, MA (US); Ludovic Godet, Boston, MA (US); Patrick M. Martin, Ipswich, MA (US); Armah Kpissay, Beverly Farms, MA (US)

(73) Assignee: Varian Semiconductor Equipment Associates, Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/829,979

(22) Filed: Mar. 14, 2013

(65) Prior Publication Data

US 2014/0272728 A1    Sep. 18, 2014

(51) Int. Cl.
*G21K 5/04* (2006.01)
*G03F 7/00* (2006.01)

(52) U.S. Cl.
CPC ........................................ *G03F 7/00* (2013.01)
USPC .................. 250/492.3; 250/492.1; 250/492.2; 250/396 R; 250/397

(58) Field of Classification Search
CPC ......... C23C 14/00; C23C 14/48; H01J 37/36; H01J 37/317; H01J 37/3171; H01J 37/32412; H01J 2237/31701; H01J 2237/3365
USPC ................. 250/492.1, 492.2, 492.22, 492.23, 250/492.3, 396 R, 397
See application file for complete search history.

(56) References Cited

U.S. PATENT DOCUMENTS

| | | | |
|---|---|---|---|
| 8,372,737 B1 * | 2/2013 | Bateman et al. | 438/527 |
| 2011/0223546 A1 | 9/2011 | Godet et al. | |
| 2012/0213941 A1 * | 8/2012 | Steen et al. | 427/535 |
| 2012/0309180 A1 * | 12/2012 | Godet et al. | 438/527 |

* cited by examiner

*Primary Examiner* — Nicole Ippolito
(74) *Attorney, Agent, or Firm* — Kacvinsky Daisak Bluni PLLC

(57) ABSTRACT

A method of treating a substrate includes directing first ions over a first range of angles to one or more photoresist features disposed on the substrate, the first ions effective to generate an altered layer in the one or more photoresist features, the altered surface layer encapsulating an inner portion of the one or more photoresist features, and directing second ions different from the first ions over a second range of angles to the one or more photoresist features, the second ions effective to generate gaseous species in the inner regions of the one or more photoresist features.

20 Claims, 7 Drawing Sheets

TECHNIQUES FOR PROCESSING PHOTORESIST FEATURES USING IONS

FIELD

This invention relates to fabrication of patterned substrates and more particularly to the use of ions to process patterned photoresist.

BACKGROUND

In present day electronic devices, continued scaling of integrated circuit features to smaller dimensions places continued pressure on patterning technology to define device features with required fidelity. Lithography is used to define patterns in mask material such as photoresist in order to provide a means to transfer desired patterns into permanent features of the device to be fabricated. For device critical dimensions (CD) smaller than about 50 nm, line edge roughness (LER) has emerged as a fundamental limiter to patterning devices.

Several features associated with lithographic patterning of photoresist contribute to LER and related problems. For one, the use of high molecular weight polymers has increased in recent technology generations because of smaller exposure doses required for patterning using such photoresists, resulting in higher substrate throughput. However, clustering that is inherent in high molecular weight polymers tends to increase LER in patterned high molecular weight photoresists, as opposed to lower molecular weight photoresists. LER is also exacerbated because of the fewer number of photons used to expose a photoresist material to be patterned, especially for high molecular weight photoresists. Each photon that strikes a photoresist material may induce photoacid diffusion into a spherical zone characteristic of the photoacid diffusion length. When only a small number of photons are used to expose a photoresist, as in high molecular weight photoresists, the overlapping spherical regions define rough boundaries at the edge of diffusion zones after the unexposed resist is removed. This so-called shot noise may define roughness on a scale that is a significant fraction of a CD for small photoresist features less than about 50 nm in CD.

The increased LER in patterned photoresist typically leads to increased LER in underlying substrate layers into which the photoresist pattern is subsequently transferred. In particular, during an etch step (pattern transfer) of an underlying layer, the LER from the photoresist is transferred at least in part to the material of the underlying layer being etched. While the etching used for the pattern transfer process, typically a reactive ion etch, may exhibit some capability of reducing LER, this is typically limited.

In the present day, reduction of LER remains an active area of efforts for most device manufacturers. Several additional processes have been tested to address this problem with marginal results. For example, dry chemical etch processes have the ability to remove material from the resist image but suffer pattern dependent loading effects from different exposed area to isolated to dense biases. In addition, it is important to maintain the photoresist CD within a tight tolerance. Hence it is desirable that any secondary applied technique to improve LER maintain the original photoresist attributes for profile, height, and CD. Dry chemical etch systems may also impart unwanted defects to the pattern resulting in yield loss. Another alternative approach that has been investigated in the use of a Deep Ultraviolet (DUV) cure where a rough pattern of photoresist lines or other small features is exposed to a lamp based platform in which heating through radiation exposure is used to smooth the photoresist lines. A drawback to this technique is a feature found in the corner of line segments where pattern pull back occurs, resulting in line deformation in such a way to render the device to be patterned useless.

BRIEF SUMMARY

In view of the foregoing, it will be apparent that improved methods and apparatus are desirable to reduce LER without otherwise compromising pattern integrity. Various embodiments involve treating patterned photoresist to reduce line roughness. In one embodiment, a method of treating a substrate comprises directing first ions over a first range of angles to one or more photoresist features disposed on the substrate, the first ions effective to generate an altered layer in the one or more photoresist features, where the altered surface layer encapsulates an inner portion of the one or more photoresist features. The method further includes directing second ions different from the first ions over a second range of angles to the one or more photoresist features, the second ions effective to generate gaseous species in the inner regions of the one or more photoresist features.

In another embodiment a method of reducing roughness in patterned photoresist layers on a substrate includes directing first ions over a first range of angles to one or more photoresist features disposed on the substrate, the first ions effective to generate an altered layer in the one or more photoresist features, the altered surface layer forming an encapsulating layer that surrounds an inner portion of the one or more photoresist features. The method also includes, after the directing the first ions, directing second ions different from the first ions over a second range of angles different from the first range of angles to the one or more photoresist features, where the second ions are effective to generate gaseous species in the inner regions of the one or more photoresist features.

DETAILED DESCRIPTION

The present embodiments are generally directed toward novel methods to treat patterned photoresist features. Various embodiments are effective to reduce line edge roughness while maintaining critical dimension in small photoresist features, such as those having a CD of less than 100 nm. The present embodiments in particular facilitate a control over the balance between LER reduction and maintaining CD within a tight margin.

In various embodiments techniques for treating photoresist features involve a so-called "bimode" ion implantation operation (also referred to herein as "bimode implantation"). The technique of bimode ion implantation includes at least two different ion treatments of photoresist features in which the ions are directed at photoresist features over a range of angles. The angular range provides ions that may strike a photoresist feature in a manner that treats all exposed surfaces of the photoresist feature. The two different ion treatments allow the different treatments to be tailored to different portions of the photoresist feature in a manner that may enhance smoothening of the photoresist features, and in particular may reduce LER and related roughness. In particular, the bimode ion implantation may facilitate treatment of a surface portion of the photoresist using a first set of ions independently of treatment of interior portions using a second set of ions. The independent treatment of surface and inner portions facilitates the creation of an optimum structure for photoresist features that reduces LER.

Figure 1A:
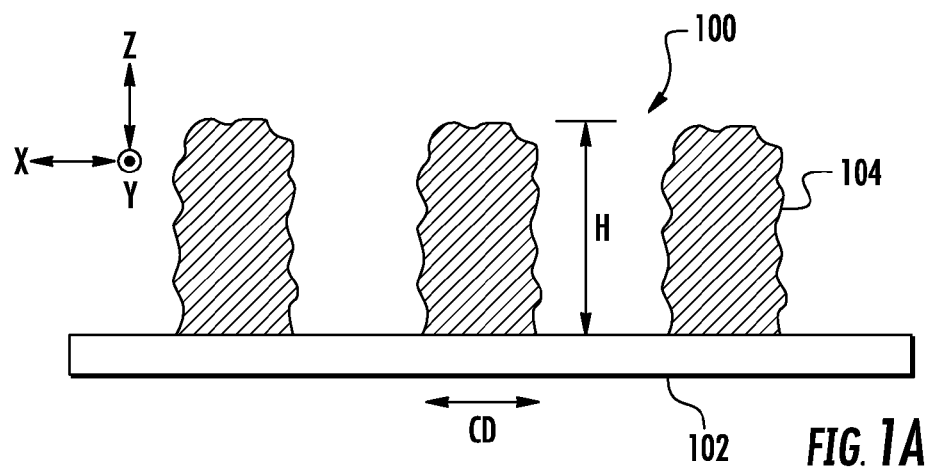
FIG. 1A depicts a side view of photoresist features with significant LER.
Figure 1B:
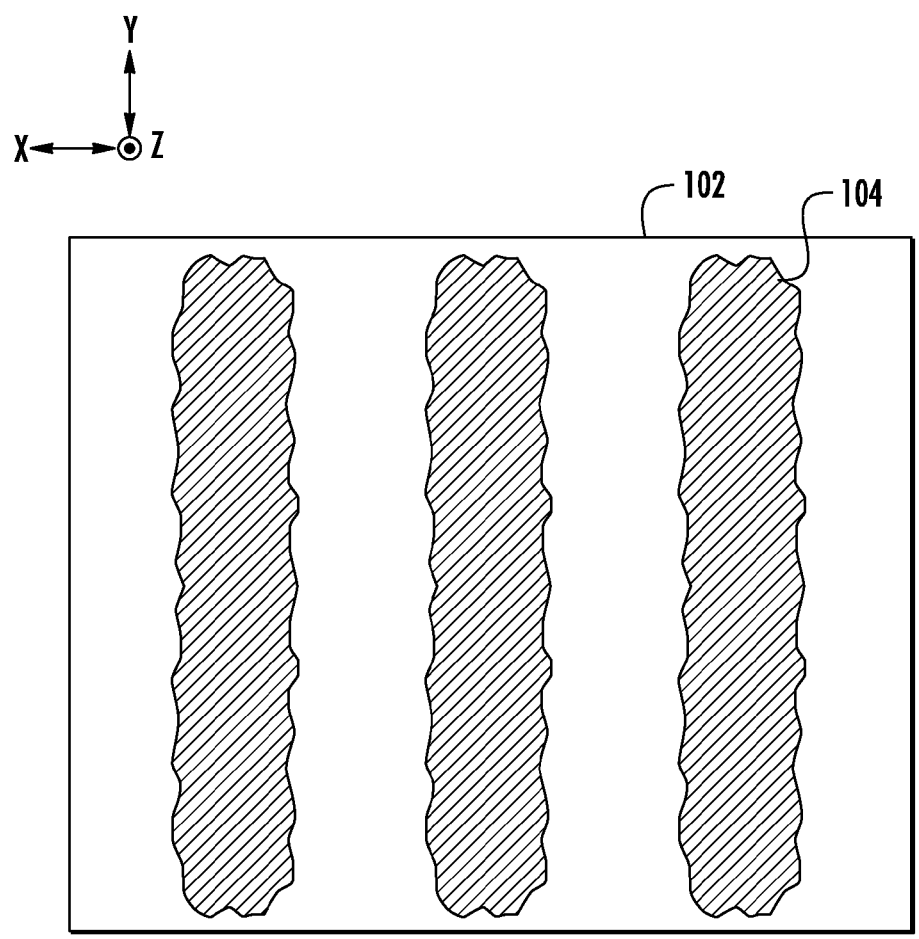
FIG. 1B depicts a top plan view of the photoresist features of FIG. 1A.

FIG. 1A and FIG. 1B depict a side view and a top plan view of a substrate 100 after formation of a pattern of photoresist features on a surface of the substrate. The base portion 102 may include any number of layers and structures (not explicitly shown. The photoresist features 104 are formed on the base portion using any known lithography technique. In some examples, the photolithography technique may be an optical lithography technique that induces line edge roughness as illustrated schematically by the undulating features shown. In some examples, the CD may have a nominal value of 5 nm to 100 nm, and the height H may range from about 10 nm to 300 nm. The LER represents deviation in the edge of a resist feature from an ideal smooth shape. LER is typically quantified as a linear dimension that reflects deviations in dimension along a line or other feature. For example, a photoresist line having a nominal width or CD of 22 nm may exhibit an LER of 3 to 5 nm. Such an LER may be subsequently transferred into device structures in the underlying substrate resulting in poor performance, a large variability in performance or failure of devices in some instances because of the wide variation in actual device dimensions within a device and deviation from designed dimensions.

Figure 2A:
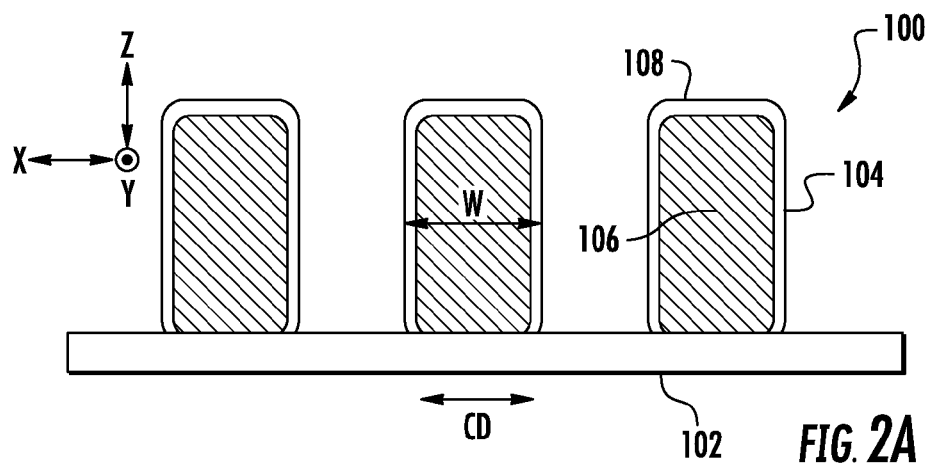
FIG. 2A depicts a side view of photoresist features of FIG. 1A after dual mode implantation to reduce LER consistent with the present embodiments.
Figure 2B:
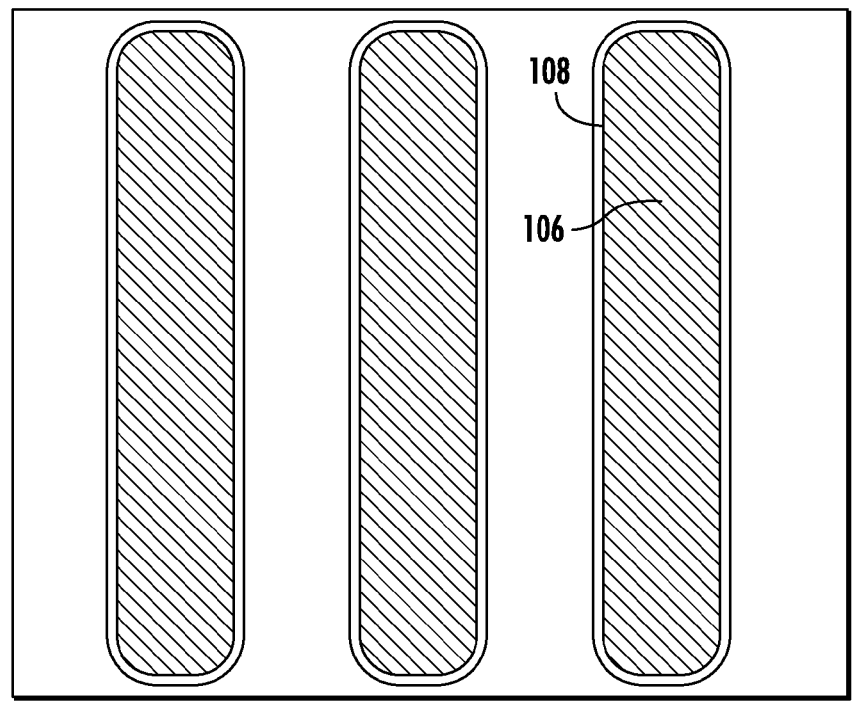
FIG. 2B depicts a top plan view of photoresist features of FIG. 2A.

Consistent with the present embodiments, a bimode implantation operation is performed to reduce photoresist roughness in patterned photoresist features. FIGS. 2A and 2B depict a side view and a top plan view of the substrate 100 shown in FIGS. 1A and 1B after being treated with a bimode implantation process, whose details are discussed below. After exposure to the bimode implantation process, the photoresist features 104 develop an altered region 108 that surrounds and encapsulates an inner portion 106. Both the altered region 108 and the inner portion 106 are subjected to interaction with ions during the bimode implantation process. One component (set of ions) of the bimode implantation process discussed below is tailored to develop the altered region 108, while another component of the bimode implantation process is tailored to induce gas formation within the inner portion 106 that results in the structure shown in FIGS. 2A and 2B. In particular, not only is line edge roughness reduced, but the actual width W of photoresist features 104 after bimode implantation is maintained at about the value of CD as shown. Accordingly, the bimode implantation process of the present embodiments provides a mechanism to reduce roughness in resist features without unwanted reduction in CD.

Figure 3:
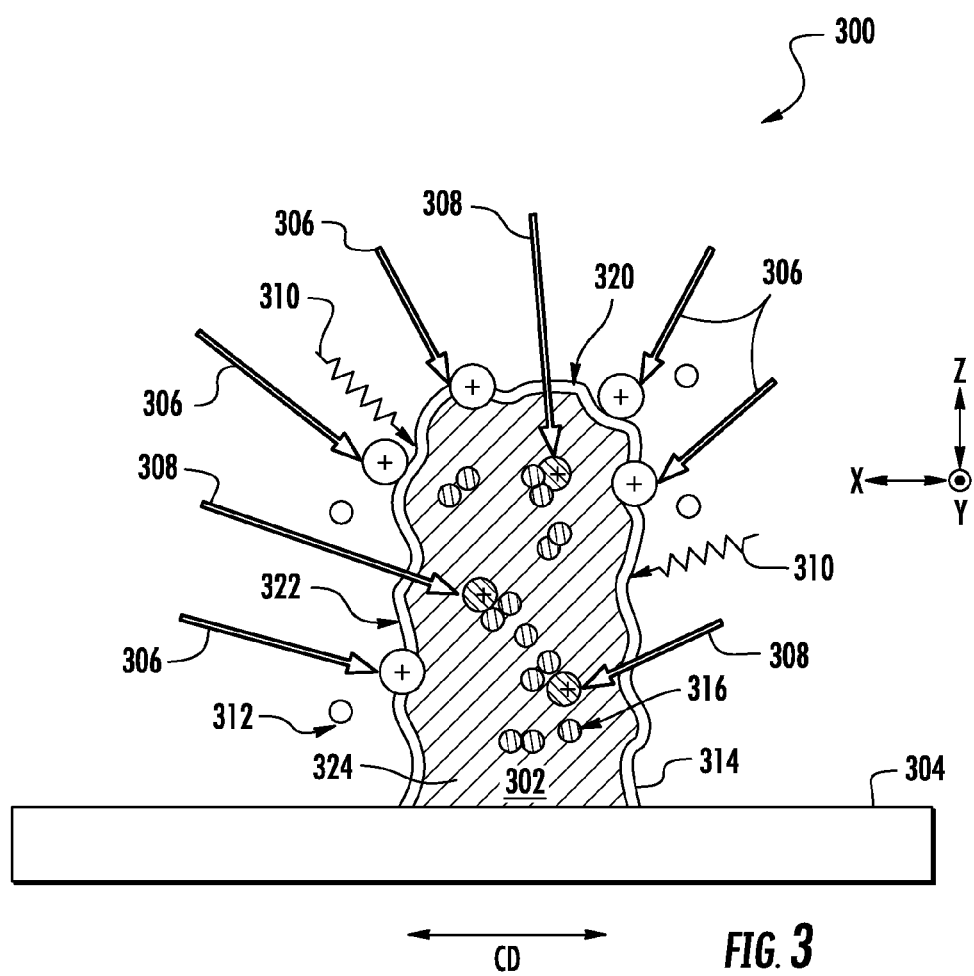
FIG. 3 depicts various features of dual mode implantation.

FIG. 3 depicts a schematic illustration of features of bimode implantation consistent with various embodiments. The substrate 300 is depicted as having a single photoresist feature 302 disposed on a substrate base 304, which resist feature represents multiple such resist features in some cases. The bimode implantation is performed upon the substrate 300 by directing two sets of ions 306 and 308 to the substrate 300. Although depicted together in FIG. 3, the ions 306 and 308 may be directed to the substrate at separate instances in various embodiments, while in other embodiments the ions 306 and 308 may be directed concurrently to the substrate 300. The ions 306 and ions 308 are directed generally over a range of angles so that top surface 320 and sidewalls 322 are exposed to the ions 306, 308. The ions 306 are generally directed to the substrate 300 before or concurrently with the ions 308. The ions 306 are configured to interact with the outer portions of the photoresist feature 302 including the outer surface region of the photoresist. The ions 306 in particular are configured to implant into the surface region of the photoresist feature to produce an altered layer 314. During the implantation the interaction of the ions 306 with polymer material of the photoresist may produce chemical alteration of the polymer, may induce the production of volatile species 312, and may yield an altered material in the altered layer 314 that is carbon rich as compared to the inner portion 324. In some embodiments, ultraviolet (UV) radiation 310 may also be directed to photoresist features 302, which may induce chemical reactions in the surface of the photoresist features 302, contributing to polymer chain scission, cross-linking or other chemical changes. Moreover, in some embodiments, ions 306 may include a chemically active species such as N, C, or F, which facilitate cross-linking and creation of a tensile stress in the altered layer.

The sum of exposure to ions 306 and optional UV radiation 310 contributes to imparting a different character to the altered layer 314 as compared to the inner portion 324. Because all exposed surfaces, that is, top surface 320, and sidewalls 322, receive exposure to the ions 306, the altered layer 314 may thereby extend over the entire exposed surfaces of the photoresist feature 302 and thereby encapsulate the inner portions 324 of the photoresist feature 302. The encapsulation of the inner portion 324 facilitates smoothening of the photoresist features as detailed in the FIGs. to follow.

In contrast to the ions 306, the ions 308 are configured to penetrate into the inner portion 324 of the photoresist feature 302. In the inner portion, the implantation of the ions 308 may cause the release of gas species 316 when the ions 308 interact with polymers of the photoresist feature 302. This gas may exert a pressure on the inside of the altered layer 314 that tends to inflate the photoresist feature 302 as detailed below. In so doing the roughness of the photoresist feature may be reduced while the inflation of the photoresist feature 302 compensates for loss of any photoresist material that is removed from the photoresist feature 302 by sputtering or evaporation during the exposure to ions 306, 308.

As further detailed below, by proper selection of processing conditions, the smoothened photoresist features may be retained and the photoresist critical dimension maintained at a desired value. In various embodiments, whether ions 306 and 308 are provided simultaneously or in succession to one another, the ions 306 generally have greater mass than ions 308. This facilitates the ability to direct the different ions 306, 308 to different parts of a photoresist feature and thereby produce an optimum photoresist feature structure. In one particular example, experiments have shown that employing a dual mode ion implantation process using an Ar/Ne mixture provides a significant improvement in control of CD and reduction of LER in narrow photoresist lines as compared to the use of "monomode" implantation using either Ar alone or Ne alone.

Figure 4A:
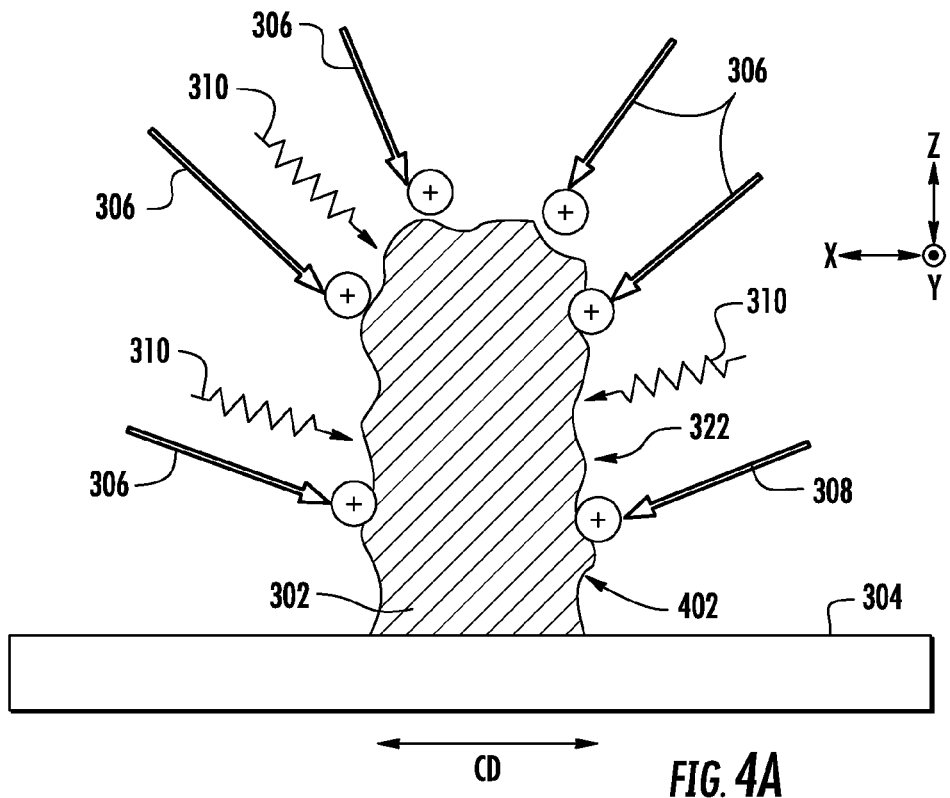
FIG. 4A depicts a first instance of dual mode implantation consistent with the present embodiments.
Figure 4B:
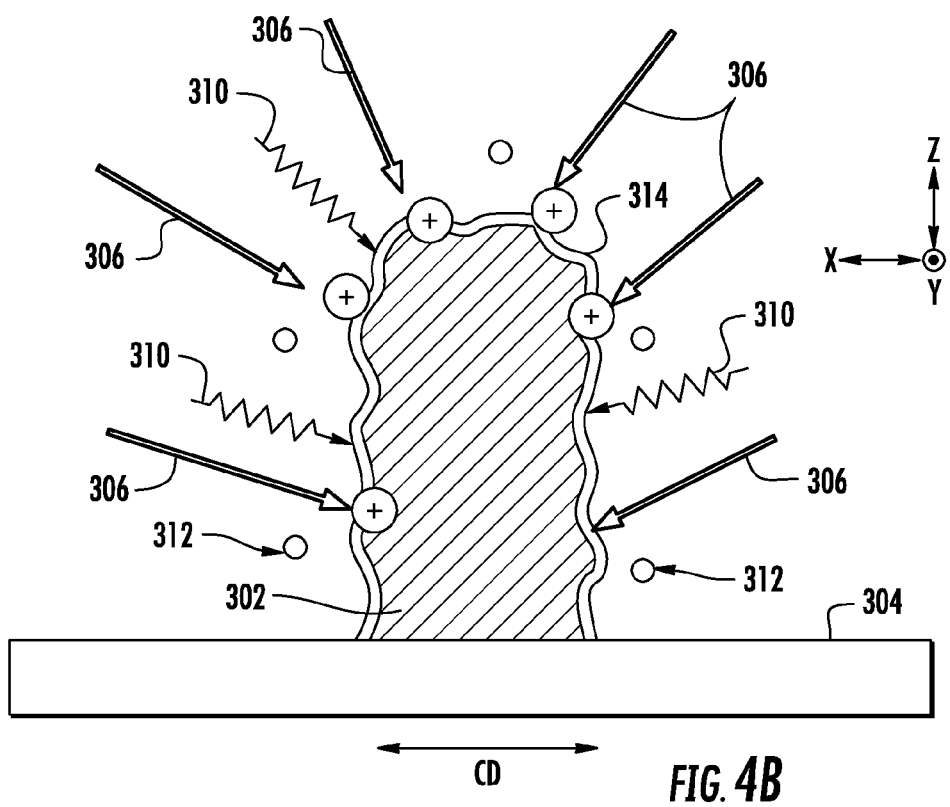
FIG. 4B depicts a second instance of the dual mode implantation of FIG. 4A.

In various embodiments one or more apparatus performs bimode implantation in two or more operations. FIG. 4A-4E depict various operations involved in a bimode operation in which two different implantation operations are performed separately. The first operation directs ions over a range of angles, and with an ion energy designed such that the ions penetrate at most only to a shallow distance from the outer surface of the photoresist, which may typically be less than about 5 nm. FIG. 4A depicts a first instance during an initial period in which such "shallow ions" impinge upon the photoresist feature 302. The photoresist feature has a width that is approximately that of a design CD, which design CD is indicated in the FIGS. 4A-4E as "CD" alongside an arrow whose length is indicative of the design CD. In this instance the total dose of ions 306 that has been received is low and the outer surface 402 has not yet developed a substantial altered layer. Subsequently, as shown in FIG. 4B as ion exposure continues the ions 306 transform the outer regions of the photoresist feature 302 such that an altered layer 314 or "skin" is formed that surrounds the formerly exposed surfaces of the photoresist feature 302. Examples of species that may be suitable to produce the ions 306 include Ar, Xe or a combination thereof; a chemically reactive species such as $N_2$, $O_2$, $F_2$, $NF_3$, or P. As suggested by FIG. 4B, the ion energy of ions 306 is tailored to locate the implant depth within a range that extends from the surface of the photoresist feature only partially into the photoresist feature so that the inner portion 324 remains unimplanted by the ions 306.

Figure 4C:
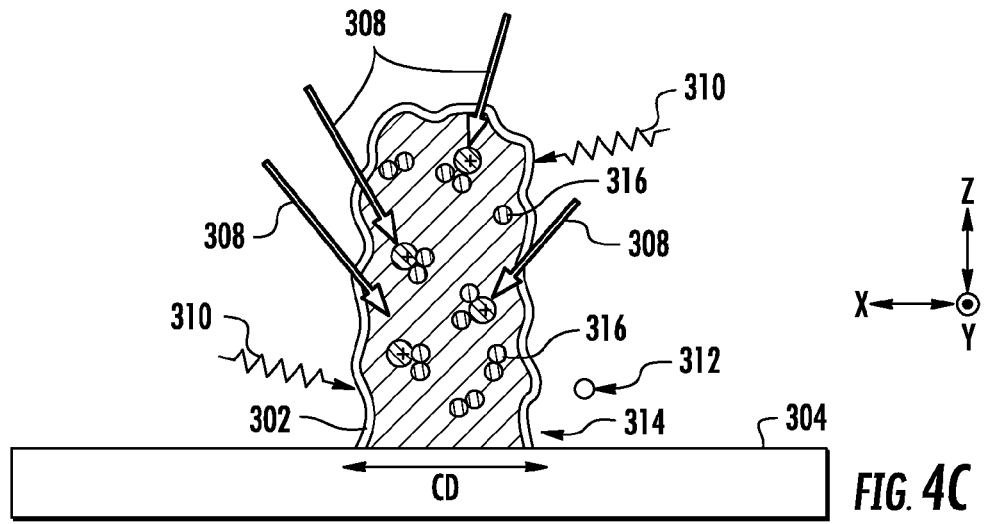
FIG. 4C depicts a third instance of dual mode implantation of FIG. 4A-4B.

In a subsequent operation shown in FIG. 4C the ions 308 are directed to the photoresist feature 302 that already contains the altered layer 314. The ions 306 may be different from the ions 308 and may have a different ion energy than those of ions 306. In particular, the ions 308 are directed with an energy that has a longer implantation range within the photoresist feature 302 than that of ions 306, which longer implantation range may be up to 50 nm in some cases. The ions 308 may in particular have a lower mass than ions 306. Suitable species for ions 308 include He, Ne, $H_2$ among others.

In the instance shown in FIG. 4C, which may represent an initial period of exposure to ions 308 the photoresist feature 302 still retains a rough shape. However, the implantation of ions 308 into the inner portion 324 produces species including the gas species 316 as illustrated. One example of gas species 316 is $H_2$ which may be generated when ions 308 interact with polymers within the photoresist feature 302. Residual gas analysis (RGA) of photoresist subject to ion implantation has shown that a predominant species released from the photoresist is $H_2$ with smaller amounts of low molecular weight hydrocarbons and possibly nitrogen-containing species also evident. As the gas species 316 builds up within the inner portion 324 the gas may diffuse in all directions including toward the altered layer 314.

Figure 5:
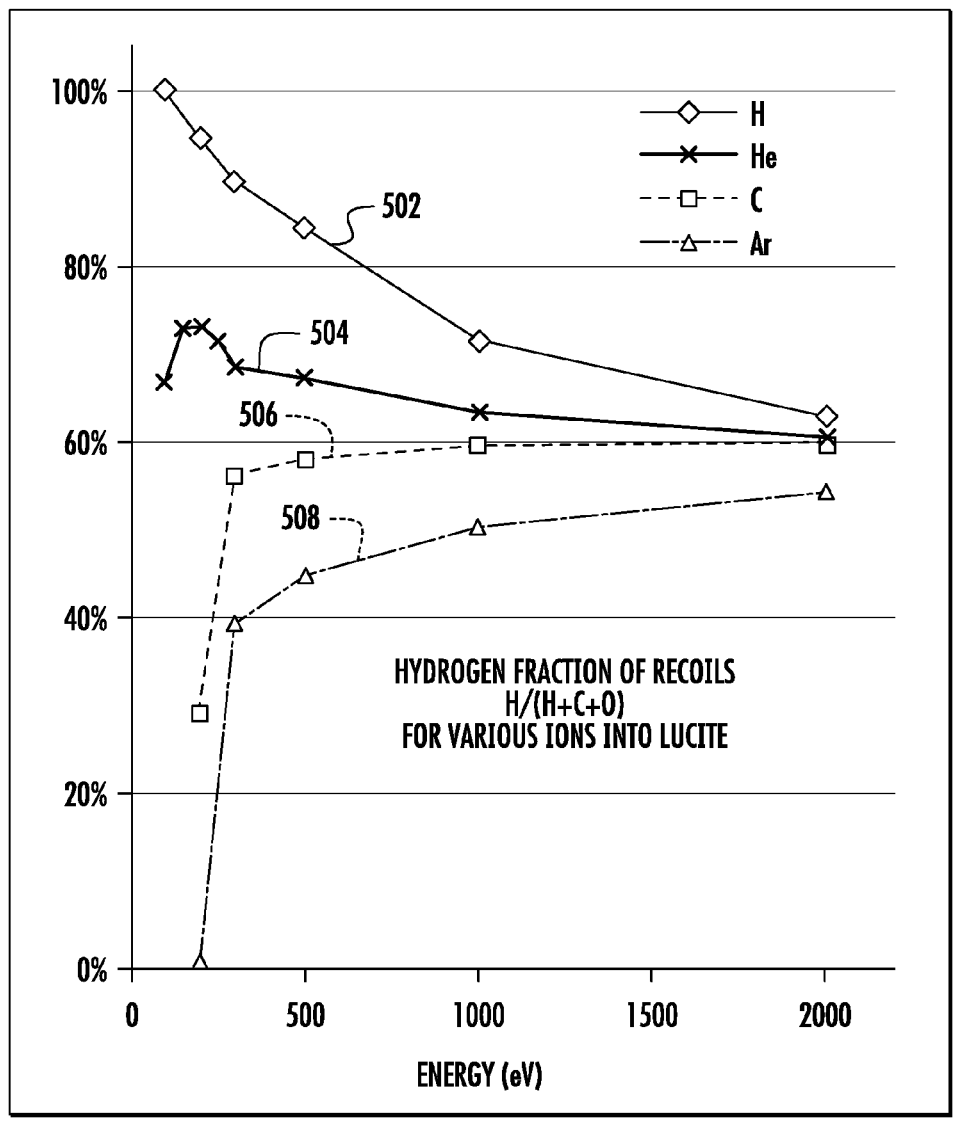
FIG. 5 depicts simulated hydrogen yield from ion implantation into polymethyl methacrylate photoresist as a function of ion species.

In accordance with various embodiments, the ion species and ion energy for ions 308 are tailored to optimize yield of gas species 316. For example, the ion species can be selected with a mass that better matches that of hydrogen in order to ensure that a large fraction of momentum transfer caused by implanting ions 308 is imparted into the hydrogen species within the photoresist feature 302. In this manner, the likelihood increases of dislodging hydrogen from the photoresist polymer during implantation. FIG. 5 depicts simulation of hydrogen yield for implantation into a photoresist material for four different ion species including hydrogen (curve 502), helium (curve 504), carbon (curve 506), and argon (curve 508). The photoresist is a known polymethyl methacrylate (Lucite) material. As shown, in the energy range at least up to 2000 eV the yield of hydrogen is above 60% for both hydrogen and helium ions. The yield using carbon ions is also in the range of 60% for the ion energy range between 500 and 2000 eV, while the yield for argon ions is lower. Accordingly, ions having a lower mass are more appropriate for use as ions 308 to yield a high fraction of gas.

Figure 4D:
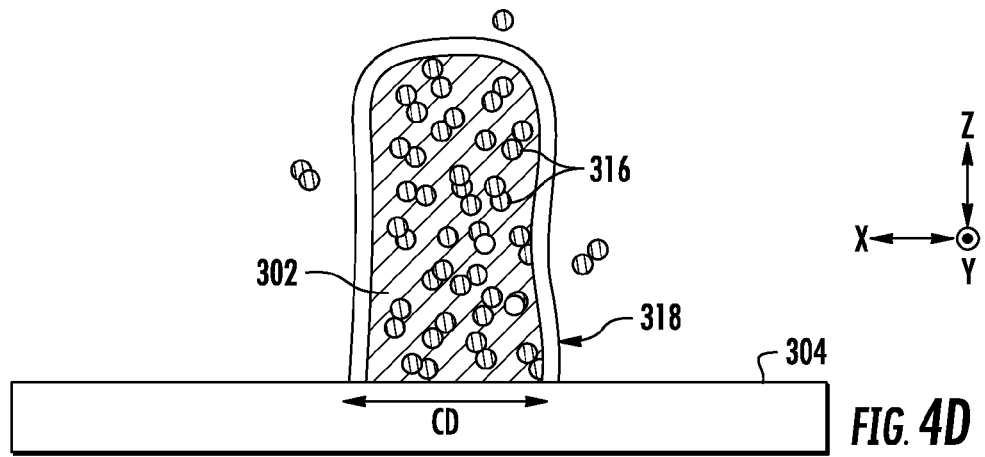
FIG. 4D depicts a fourth instance of the dual mode implantation of FIGS. 4A-4C.

FIG. 4D depicts the structure of the photoresist feature at an instance subsequent to the exposure to the ions 308 shown in FIG. 4C. As illustrated a large number of gas species 316 have been produced, which gas species exert a pressure within the photoresist feature 302. This pressure tends to inflate the photoresist feature 302. The altered layer 314 presents a barrier to outdiffusion of the gas species 316, which results in an expansion of the photoresist feature 302 in response to the pressure created by the gas species 316. The expansion may result in an increase in width (along the X-direction) of the photoresist feature, which may counteract a reduction in CD that takes place during the exposure to ions 306 and 308. In addition, the expansion may reduce the roughness of the photoresist feature 302.

Figure 4E:
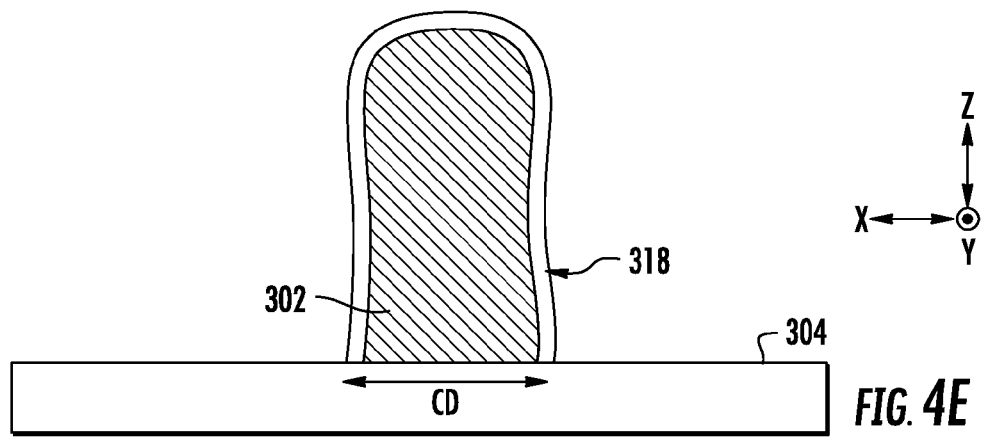
FIG. 4E depicts a fifth instance of the dual mode implantation of FIGS. 4A-4D.

FIG. 4E shows the structure of the photoresist feature 302 after completion of bimode implantation. The photoresist feature 302 retains the altered layer 314 and inner portion 324. The roughness of the photoresist feature 302 is reduced as compared to before bimode implantation, while the width is maintained at a value of the CD. The gas species 316 may also gradually outdiffuse from the photoresist feature 302. In order to optimize the bimode implantation process, an elevated temperature may be imparted into the substrate 300 during operations generally shown in FIGS. 4A to 4D. The substrate 300 including photoresist features 302 may be heated to an elevated temperature using a heat source and/or may experience a rise in temperature during the implantation processes. At elevated temperature plastic deformation of the photoresist features 302 is facilitated, which deformation results in the expanded and smoothed shape of the photoresist feature 302 shown in FIG. 4D. Subsequently, the photoresist feature 302 may be cooled and may retain its expanded and smoothed shape as shown in FIG. 4E.

In the bimode implantation operations shown in FIGS. 4A-to 4C because ions 306 are provided at a separate instance from ions 308, the distribution of angles of incidence for the ions 306 may be different than that of ions 308. In some cases the ions 306 may be provided over a wider angular range than that used for implantation of ions 308. This may be particularly useful to ensure that all surfaces of the photoresist features 302 are adequately exposed to the ions 306 to generate a complete continuous altered layer 314 that acts as a barrier to outgassing of the gas species 316. The ions 306, on the other hand, may be directed to the substrate over a narrower range of angles, which may be closer to perpendicular to a plane of the substrate base 304, as suggested by FIG. 4C. This is because a purpose of the exposure to ions 308 is the generation of gas species 316 within the inner portion 324 of the photoresist feature 302. The generation of gas species 316 in inner portion 324, in turn, does not require that all regions of the surface of the photoresist feature 302 are impacted by ions 308. The bimode implantation shown in FIGS. 4A-4E provides the further advantage that the first dose of ions 306 to form an optimal encapsulating layer (altered layer 314) can be separately tailored from the second dose of ions 308 used to develop gas species 316. In general the optimum dose for ions 306 and 308 may differ and therefore are more readily achieved when provided in separate operations.

Figure 6A:
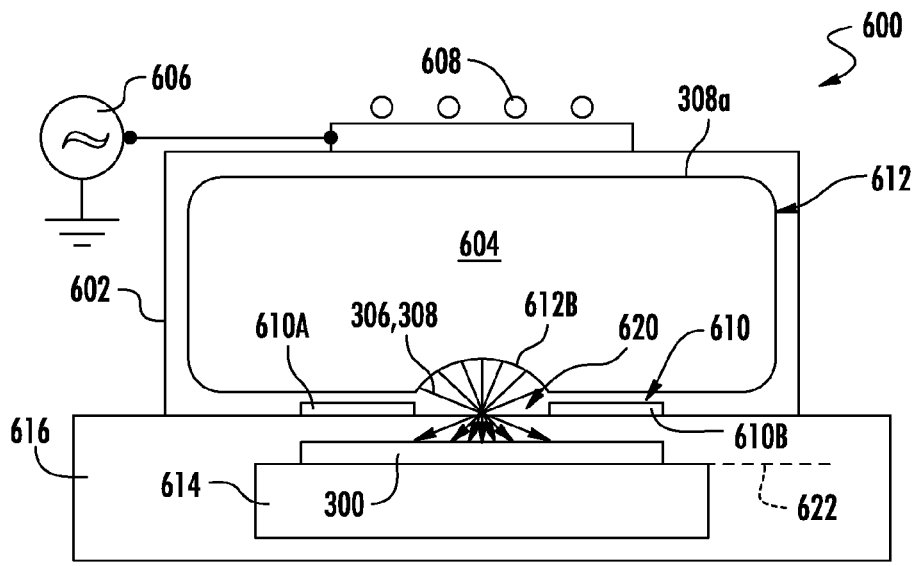
FIG. 6A depicts an exemplary processing system that may be used for dual mode implantation.
Figure 6B:
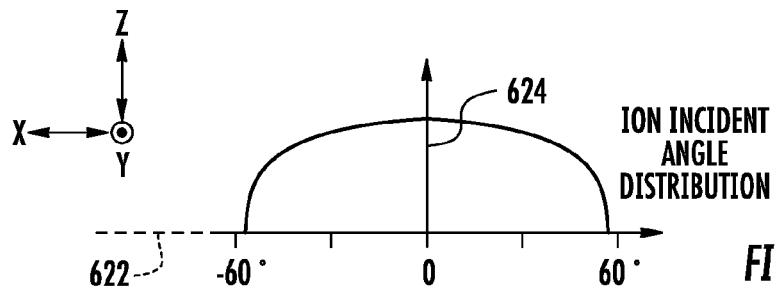
FIG. 6B depicts an exemplary distribution of ion angles of implantation ions consistent with the present embodiments.
Figure 6C:
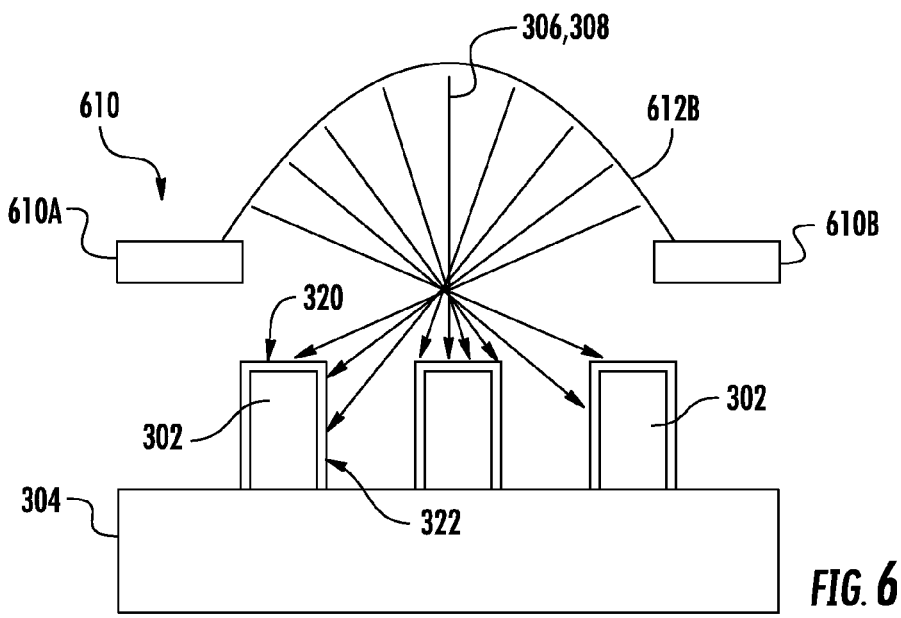
FIG. 6C depicts details of geometry of the processing system of FIG. 6A and a substrate.

Consistent with further embodiments, FIG. 6A depicts an exemplary processing system 600 for performing bimode implantation. The processing system 600 includes a plasma chamber 602 in which a plasma 604 may be generated. A plasma source for the plasma 604 may, in various embodiments, be an in situ or remote, inductively coupled plasma source, capacitively coupled plasma source, helicon source, microwave source, or any other type of plasma source. In the specific embodiment depicted in FIG. 6A, a radio frequency (RF) generator 606 is coupled to RF coils 608 to generate the plasma 604. Ions for performing bimode implantation, such as ions 306, 308 are extracted from the plasma 604 in a manner described below to implant into the substrate 300 that is disposed on a substrate holder 614 located in the process chamber 616. over a range of angles The processing system 600 includes a plasma sheath modifier (PSM) 610 adjacent to a portion of the plasma chamber 602 that is proximate the process chamber 616. Consistent with the present embodiments, the PSM 610 defines one or more apertures 620 that are used to direct the ions 306, 308 over a range of angles to the substrate 300. The PSM 610 acts to cause a local perturbation in the edge of a plasma sheath of plasma 604, as illustrated in more detail in an embodiment illustrated in FIG. 6C, for example. By doing so, the shape of plasma sheath proximate the aperture can be controlled in a manner that causes ions 306,308 to exit the plasma 604 and impinge on the substrate 300 over a range of angles. By changing experimental conditions such as chamber pressure, plasma power, and so forth, the exact distribution of angle of incidence of ions 306, 308 can be altered. FIG. 6B depicts an exemplary distribution of angles of incidence that may be provided by the processing system 600. As illustrated, ions may impinge upon the substrate over a range of about −60 to +60 degrees with respect to a perpendicular 624 to a substrate plane 622. Thus, referring to FIG. 6C, ions 306, 308 impinge upon both top surface 320 and sidewalls 322. Additional description of general features of a processing system with a PSM can be found in co-pending U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference.

In various embodiments, dual mode implantation is performed using a processing system such as processing system 600 by generating a plasma 604 containing the ions 306 in a first instance and directing the ions 306 to the substrate 300. Subsequently, the processing system 600 may generate a plasma containing the ions 308 and direct the ions 308 to the substrate 300. In this operation, besides changing the ion species in plasmas between the two different ion implantation operations, the ion energy, gas pressure, plasma power, and other experimental parameters may be changed between ion implantation operations. This affords the ability to more precisely tailor the location of the ions 306, 308 and their impact on the photoresist features, to facilitate the different processes shown above in FIGS. 4A-4D in particular.

In embodiments in which dual mode implantation is conducted by directing two different set of ions to a substrate simultaneously, the general features of dual mode implantation shown in FIG. 3 may be achieved. However, because the ions are simultaneously extracted from the same plasma, the ion energy and distribution of angles of incidence is generally not independently controlled between the two sets of ions. In some variants, the range of the ions with the same energy can be controlled by selecting the mass of the ions which is determined by the selection of the gas used. Many possible gases, such as $NH_3$, $CH_4$, $SiH_4$, or $Al_2(CH_3)_6$, produce relatively more massive ions such as $N^+$, $Si^+$, $C^+$ and $Al^+$ which are suitable candidates for ions 306 and simultaneously less massive ions such as $H^+$ suitable for ions 308. In this variant, although the energy of the different ions is the same, the lighter ions will penetrate more deeply and treat the interior of the photoresist features, while the heavier ions will have a shorter range and will treat the superficial regions. Thus, in these variants ions 306 and 308 may be derived from a single gas precursor species such as the aforementioned $NH_3$, $CH_4$, $SiH_4$, or $Al_2(CH_3)_6$. However in other variants, multiple different gas species may be provided simultaneously to generate ions 306 and 308 at the same time.

In one variant of simultaneous dual mode implantation both ions 306 and 308 may be directed to a substrate 300 concurrently during a first period, followed by a second period in which only one of the sets of ions 306, 308 is directed to the substrate 300. For example, after an initial period it may be deemed that the ion dose of ions 306 for forming an altered layer 314 of desired thickness has been reached. However, it may be desirable to continue to implant into the photoresist feature 302 to evolve more gaseous species. Accordingly, after the first period, the source of ions 306 may be stopped while ions 308 continue to be implanted into the photoresist.

In additional embodiments, after a dual mode operation is performed, an additional ion implantation is performed at normal incidence, that is, along the perpendicular 624. The additional ion implantation is performed to create a thicker altered layer 314. This thicker altered layer provides additional protection of the photoresist feature 302 to subsequent etching processes used to transfer the pattern of the photoresist features 302 into the substrate base 304.

The present embodiments provide novel techniques and apparatus for reducing photoresist roughness especially in small patterned photoresist features. A dual mode implantation process is disclosed that involves a combination of two different ion implantation operations that together reduce roughness in photoresist features without loss in critical dimension. The dual mode ion implantation process entails directing two different sets of ions over a range of angles to impinge upon all exposed surfaces of photoresist features including tops and sides of such features. A first set of ions produces an encapsulating altered layer or skin on the outer surface region of photoresist features. A second set of ions generates gas species within the encapsulated photoresist features that inflates the encapsulated features and reduces the surface roughness.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of treating a substrate, comprising:
directing first ions over a first range of angles to one or more photoresist features disposed on the substrate, the first ions effective to generate an altered layer in a surface region of the one or more photoresist features, the altered layer encapsulating an inner portion of the one or more photoresist features; and
directing second ions different from the first ions over a second range of angles to the one or more photoresist features, the second ions effective to generate gaseous species in the inner regions of the one or more photoresist features.

2. The method of claim 1, the first angular range comprising a same angular range as the second angular range.

3. The method of claim 1, the first angular range comprising a wider angular range than the second angular range.

4. The method of claim 1, the first ions comprising a first ion energy, and the second ions comprising a second ion energy different from the first ion energy.

5. The method of claim 1, the first ions comprising one or more of Ar, Xe, $N_2$, $O_2$, $F_2$, $NF_3$, and $PF_3$ and the second ions comprising one or more of He, Ne, and $H_2$.

6. The method of claim 1, comprising directing the second ions subsequently to the first ions.

7. The method of claim 1, further comprising:
establishing a substrate temperature at a first temperature greater than room temperature before or during the directing first ions; and
reducing the substrate temperature to a second substrate temperature after the directing the second ions.

8. The method of claim 1, comprising:
directing the first ions and second ions simultaneously to the substrate during a first period; and
directing only the second ions to the substrate during a second period subsequent to the first period.

9. The method of claim 8, the first ions comprising one or more of Ar, $NH_3$, $CH_4$, Ne, and the second ions comprising one or more of He and $H_2$.

10. The method of claim 1, further comprising:
forming the first ions and the second ions from a common precursor gas; and
directing the first ions and second ions simultaneously to the substrate.

11. The method of claim 1, further comprising, after the directing the first and second ions, directing third ions at an angle of incidence generally perpendicular to a plane of the substrate.

12. The method of claim 11, the third ions comprising a third ion energy greater than a first ion energy of the first ions and a second ion energy of the second ions.

13. The method of claim 1, the photoresist comprising a polymer material that generates the gaseous species at least in part as hydrogen gas.

14. The method of claim 1, wherein diffusivity of the gaseous species through the altered layer is less than diffusivity of the gaseous species through the inner region.

15. A method of reducing roughness in patterned photoresist layers on a substrate, comprising:
directing first ions over a first range of angles to one or more photoresist features disposed on the substrate, the first ions effective to generate an altered layer in the one or more photoresist features, the altered layer forming an encapsulating layer that surrounds an inner portion of the one or more photoresist features; and
after the directing the first ions, directing second ions different from the first ions over a second range of angles different from the first range of angles to the one or more photoresist features, the second ions effective to generate gaseous species in the inner regions of the one or more photoresist features.

16. The method of claim 15, the first angular range comprising a wider angular range than the second angular range.

17. The method of claim 15, the first ions comprising a first ion energy, and the second ions comprising a second ion energy different from the first ion energy.

18. The method of claim 15, further comprising, after the directing the first and second ions, directing third ions at an angle of incidence generally perpendicular to a plane of the substrate, the third ions comprising a third ion energy greater than a first ion energy of the first ions and a second ion energy of the second ions.

19. The method of claim 15, the photoresist comprising a polymer material that generates the gaseous species at least in part as hydrogen gas, wherein the altered layer comprises a carbon rich composition as compared to composition of the inner portion of the photoresist features.

20. The method of claim 15, wherein the directing the first ions and second ions comprises:
generating a plasma having a plasma sheath; and
modifying a shape of a boundary between the plasma and the plasma sheath with a plasma sheath modifier so that a portion of the boundary facing a front surface of the substrate is not parallel to a plane defined by the front surface.

* * * * *